United States Patent

Smith

(10) Patent No.: US 7,339,810 B1
(45) Date of Patent: Mar. 4, 2008

(54) DEVICE AND METHOD FOR ENSURING CURRENT CONSUMPTION IN SEARCH ENGINE SYSTEM

(75) Inventor: Scott Smith, San Jose, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 130 days.

(21) Appl. No.: 11/089,837

(22) Filed: Mar. 24, 2005

(51) Int. Cl.
*G11C 15/00* (2006.01)

(52) U.S. Cl. ............... 365/49; 365/189.02; 365/189.07; 365/230.02; 711/108; 711/156; 711/158

(58) Field of Classification Search ................. 365/49, 365/189.02, 230.02, 189.07; 36/189.07; 711/108, 156, 158
See application file for complete search history.

(56) References Cited

U.S. PATENT DOCUMENTS

| | | | |
|---|---|---|---|
| 6,081,440 A | 6/2000 | Washburn et al. | |
| 6,108,227 A | 8/2000 | Voelkel | |
| 6,240,000 B1 | 5/2001 | Sywyk et al. | |
| 6,253,280 B1 | 6/2001 | Voelkel | |
| 6,266,262 B1 | 7/2001 | Washburn et al. | |
| 6,370,613 B1 | 4/2002 | Diede et al. | |
| 6,373,738 B1 * | 4/2002 | Towler et al. ................ 365/49 | |
| 6,480,406 B1 | 11/2002 | Bo et al. | |
| 6,502,163 B1 | 12/2002 | Ramankutty | |
| 6,504,740 B1 | 1/2003 | Voelkel | |
| 6,505,270 B1 | 1/2003 | Voelkel et al. | |
| 6,515,884 B1 | 2/2003 | Sywyk et al. | |
| 6,647,457 B1 | 11/2003 | Sywyk et al. | |
| 6,661,716 B1 | 12/2003 | Sywyk et al. | |
| 6,697,275 B1 | 2/2004 | Sywyk et al. | |
| 6,721,202 B1 | 4/2004 | Roge et al. | |
| 6,751,755 B1 | 6/2004 | Sywyk et al. | |
| 6,760,242 B1 | 7/2004 | Park et al. | |
| 6,763,426 B1 | 7/2004 | James et al. | |
| 6,772,279 B1 | 8/2004 | Sun et al. | |
| 6,804,744 B1 | 10/2004 | Abbas | |
| 6,845,024 B1 | 1/2005 | Wanzakhade et al. | |
| 6,876,558 B1 | 4/2005 | James et al. | |
| 6,892,273 B1 | 5/2005 | James et al. | |
| 6,958,925 B1 * | 10/2005 | Om et al. ..................... 365/49 | |
| 7,028,136 B1 * | 4/2006 | Priyadarshan et al. ...... 711/108 | |
| 7,099,170 B1 * | 8/2006 | Narum et al. ................. 365/49 | |

OTHER PUBLICATIONS

U.S. Appl. No. 10/271,660, James, David.
U.S. Appl. No. 10/320,049, James, David.
U.S. Appl. No. 10/286,198, James, David.
U.S. Appl. No. 10/286,199, Rajamanickam, Jagad.
U.S. Appl. No. 10/281,814, James, David.

(Continued)

*Primary Examiner*—Richard T. Elms
*Assistant Examiner*—Eric Wendler
(74) *Attorney, Agent, or Firm*—Haverstock & Owens, LLP

(57) ABSTRACT

A search engine system (100) can include a key multiplexer (104) and logic circuit (108). A key from a previous operation can be received by logic circuit (108) and altered to generate an idle key. In a non-search operation, the idle key can be applied to a CAM section to draw current as in a normal search operation. Logic circuit (108) can ensure that an idle key value is always different than a previously applied key value.

20 Claims, 4 Drawing Sheets

OTHER PUBLICATIONS

U.S. Appl. No. 10/264,667, James, David.
U.S. Appl. No. 10/264,668, Rajamanickam, Jagad.
U.S. Appl. No. 10/329,146, James, David.
U.S. Appl. No. 10/266,953, Wanzakhade, Sanjay.
U.S. Appl. No. 10/320,588, Wanzakhade, Sanjay.
U.S. Appl. No. 10/320,053, Wanzakhade, Sanjay.
U.S. Appl. No. 10/202,526, Zou, Janet.
U.S. Appl. No. 10/873,608, Meng, Anita X.
U.S. Appl. No. 10/746,899, Om, Hari.
U.S. Appl. No. 11/000,568, Smith, Scott.
U.S. Appl. No. 11/011,464, Smith, Scott.
U.S. Appl. No. 10/897,062, Venkatachary, Sriniv.
U.S. Appl. No. 10/940,129, Narum, Steven.
U.S. Appl. No. 10/950,323, Birman, Mark.
U.S. Appl. No. 10/977,516, Om, Hari.
U.S. Appl. No. 11/014,123, Om, Hari.
U.S. Appl. No. 11/043,391, Gupta, Pankaj.
U.S. Appl. No. 60/612,905, Venkatachary, Sriniv.
U.S. Appl. No. 60/663,656, Maheshwari, Dinesh.
U.S. Appl. No. 60/861,745, Maheshwari, Dinesh.
U.S. Appl. No. 60/657,754, Maheshwari, Dinesh.
U.S. Appl. No. 60/629,694, Jiang, Bin.
U.S. Appl. No. 60/666,876, Maheshwari, Dinesh.
U.S. Appl. No. 11/085,399, Om, Hari.
U.S. Appl. No. 11/089,837, Smith, Scott.
U.S. Appl. No. 60/667,325, Om, Hari.
U.S. Appl. No. 10/217,746, Chou, Richard.
U.S. Appl. No. 11/090,116, Banachowicz, Bartosz.

\* cited by examiner

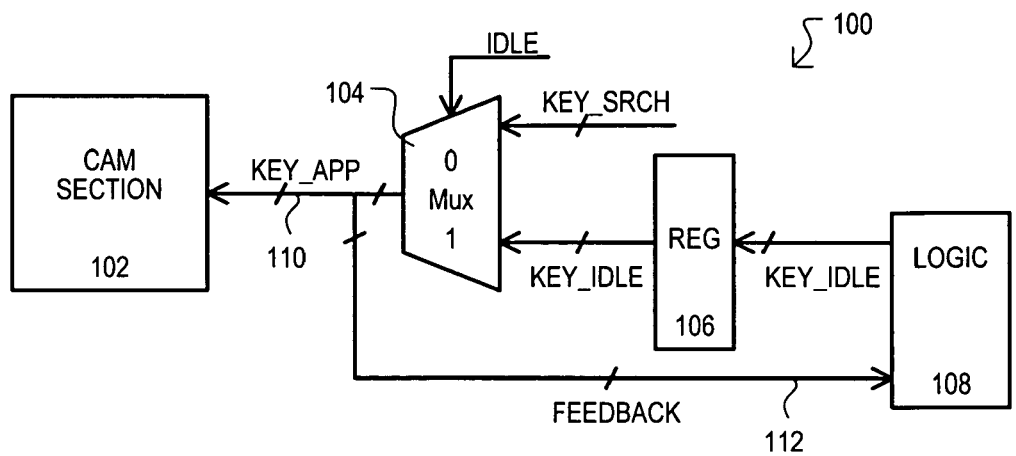
FIG. 1
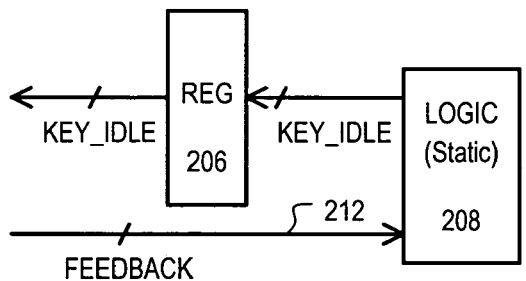
FIG. 2A
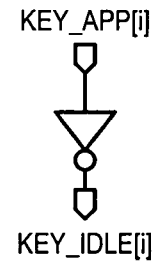
FIG. 2B
| CYCLE | KEY_APP |
|---|---|
| 0 (REG) | 0011 0101 1101 0111 |
| 1 (IDLE) | 1100 1010 0010 1000 |
| 2 (IDLE) | 0011 0101 1101 0111 |
FULL COMPLEMENT
FIG. 3A
| CYCLE | KEY_APP |
|---|---|
| 0 (REG) | 0011 0101 1101 0111 |
| 1 (IDLE) | 0110 0000 1000 0010 |
| 2 (IDLE) | 0011 0101 1101 0111 |
PARTIAL COMPLEMENT FIXED (ALT)
FIG. 3B
| CYCLE | KEY_APP |
|---|---|
| 0 (REG) | 0011 0101 1101 0111 |
| 1 (IDLE) | 1011 1101 0101 1111 |
| 2 (IDLE) | 0011 0101 1101 0111 |
PARTIAL COMPLEMENT FIXED (1/4)
FIG. 3C

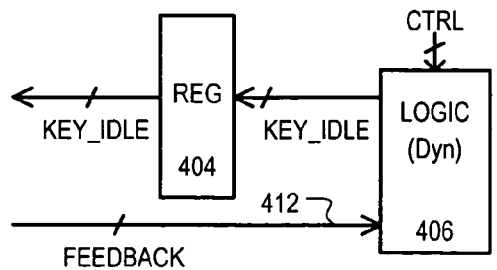
FIG. 4A
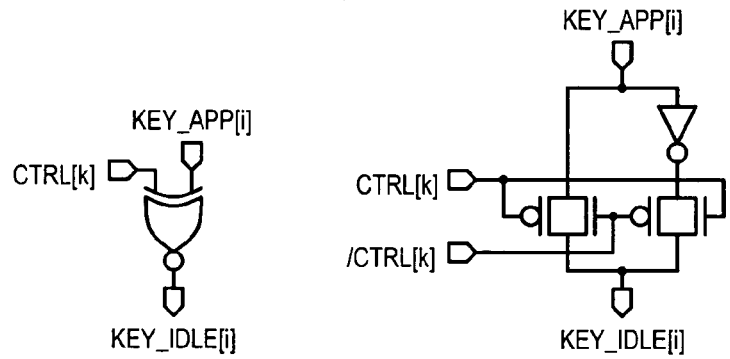
FIG. 4B                FIG. 4C
| CYCLE | KEY_APP |  |  |  |
|---|---|---|---|---|
| 0 (REG) | 0011 | 0101 | 1101 | 0111 |
| 1 (IDLE) | 1011 | 1101 | 0101 | 1111 |
| 2 (IDLE) | 1111 | 1001 | 0001 | 1011 |
| 3 (IDLE) | 1101 | 1011 | 0011 | 1001 |
PARTIAL COMPLEMENT ROLLING (1/4)
FIG. 5A
| CYCLE | KEY_APP |  |  |  |
|---|---|---|---|---|
| 0 (REG) | 0011 | 0101 | 1101 | 0111 |
| 1 (IDLE) | 1100 | 0101 | 1101 | 0111 |
| 2 (IDLE) | 0011 | 1010 | 1101 | 0111 |
| 3 (IDLE) | 1100 | 0101 | 0010 | 0111 |
RAMP (x4)
FIG. 5B
| CYCLE | KEY_APP |  |  |  |
|---|---|---|---|---|
| 0 (REG) | 0011 | 0101 | 1101 | 0111 |
| 1 (IDLE) | 1100 | 1010 | 1101 | 0111 |
| 2 (IDLE) | 1100 | 1010 | 0010 | 1000 |
| 3 (IDLE) | 0011 | 0101 | 0010 | 1000 |
TOP/BOTTOM
FIG. 5C

| CYCLE | KEY_APP |   |   |   |
|---|---|---|---|---|
| 0 (REG) | 0101 | 0101 | 0101 | 0101 |
| 1 (IDLE) | 0101 | 0101 | 0101 | 0101 |
| 2 (IDLE) | 0101 | 0101 | 0101 | 0101 |
| 3 (REG) | 1010 | 1101 | 1111 | 0110 |

DEVICE AND METHOD FOR ENSURING CURRENT CONSUMPTION IN SEARCH ENGINE SYSTEM

TECHNICAL FIELD

The present invention relates generally to search engine systems, and more particularly to methods and devices related to current consumption in such systems.

BACKGROUND OF THE INVENTION

Search engine systems can receive a key value, and rapidly compare such a key value against a large number of entries. Many search engine systems can be based on content addressable memories (CAMs). A CAM can provide rapid matching between a specific pattern of received data bits, commonly known as a search key or comparand, and data values stored in a CAM memory array. CAMs can provide advantageous matching speeds as entries (or locations) of an entire CAM array can be searched in parallel. This is in contrast to other types of memory devices (such as static random access memories (SRAM) or dynamic RAMs (DRAMs)) that typically access a single entry at a time.

A drawback to such essentially simultaneous access of multiple entries can be the large current draws (dI/dt spikes) that can result. Large current spikes can create issues with respect to an external power supply for the CAM. For example, when extreme current spikes occur a voltage drop across the entire device can occur. Unchecked, such a voltage drop can cause a CAM to slow down in speed (and hence fall out of specified operating speeds) or functionally fail. Even more particularly, to compensate for a voltage drop resulting from a search operation, a power supply can increase the sourcing of current to the CAM device in an effort to restore voltage levels to the desired level. If a next cycle is a non-search operation (e.g., idle cycle), a CAM device will not have a substantial current draw, and thus not have a transient current spike. However, a power supply response can typically lag actual CAM device needs, due to the time needed for sensing circuits to detect such voltage changes. Thus, during such a non-search cycle, a power supply may still be supplying current at the search level. This can generate an undesirable increase in voltage across the CAM device. A power supply may sense such an increase in voltage, and reduce current in an attempt to bring down a voltage to a desired level. If another search occurs, the pattern can repeat itself with a power supply adversely lagging in response to actual CAM current needs.

Various approaches to reducing current spikes have been proposed. One approach includes ensuring that a same amount of current across all operations, whether a search is occurring or not. This can prevent supply collapse and/or bounce, as a power supply may be providing about the same current level at all times. More particularly, a CAM device can execute "dummy" searches during idle or other non-search cycles, and discard any search results. In still other approaches, during a start-up operation, a successively larger number of CAM blocks can be activated to reduce turn-on current surges.

One such approach is shown in U.S. patent application Ser. No. 10/940,129 titled REDUCED TURN-ON CURRENT CONTENT ADDRESSABLE MEMORY (CAM) DEVICE AND METHOD, filed on Sep. 12, 2004, by Narum et al., now U.S. Pat. No. 7,099,170, issued on Aug. 29, 2006. Another approach is shown in U.S. patent application Ser. No. 11/014,123 titled METHOD AND APPARATUS FOR SMOOTHING CURRENT TRANSIENTS IN A CONTENT ADDRESSABLE MEMORY (CAM) DEVICE WITH DUMMY SEARCHES, filed on Dec. 15, 2004, by Om et al., now U.S. Pat. No, 7,149,101, issued on Dec. 12. 2006.

A detailed example of one approach to executing dummy searches is shown in a block schematic diagram of FIG. 9, and designated by the general reference character 900. FIG. 9 shows a CAM device (e.g., search engine) 900 that includes a CAM section 902, a key multiplexer 904, and a register 906. A CAM section 902 can execute search operations in response to an applied key value KEY_APP.

In an actual (e.g., not a dummy) search operation, a selection signal IDLE can be low, and key multiplexer 904 can provide a regular search key KEY_SRCH to CAM section 902. In an idle operation, a selection signal IDLE can be high, and key multiplexer 904 can provide an idle search key KEY_IDLE to CAM section 902. An idle key KEY_IDLE can be a previous search key applied to a CAM section that has been stored in register 906 by way of a feedback path 908.

FIG. 10 shows the operation of the arrangement like that of FIG. 9. FIG. 10 shows a resulting applied key value for three cycles 0-3. A first cycle 0 can be a regular search cycle, and a received key value can be the applied key value. The key for cycle 0 can be stored in a register 906. The next two cycles 1-2 can be idle cycles, thus the same key value applied in cycle 0 (stored in register 906) can be applied in cycles 1-2. Cycle 3 can be another regular search cycle, thus a new search key can be applied.

A drawback to the arrangement shown in FIGS. 9 and 10 can be the resulting current usage pattern. Because the key applied in an idle cycle is the same as a previously applied key, wires carrying the key data may not switch states (toggle) and hence consume considerably less power. Thus, the current consumed in the subsequent idle cycle can be less than that consumed in a previous search cycle. As a result, the current drawn will not be essentially the same across search and non-search (e.g., idle) cycles.

In light of the above, it would be desirable to arrive at some way of ensuring that current drawn in search and non-search (e.g., idle) cycles are close to one another than that achieved in conventional arrangements.

SUMMARY OF THE INVENTION

The present invention can include a search engine system having a content addressable memory (CAM) section that can draw current in response to an applied key value. The search engine system can also include a logic circuit that changes at least a portion of the applied key value to generate an idle key value, and a selection circuit that can selectively provide a key value associated with a search operation or the idle key value as the applied key value.

In this way, an idle key, which can be applied in non-search operations, can be different from any previously applied key value, and thus ensure some predetermined current draw amount.

According to one aspect of the embodiments, a logic circuit can change all the bits of the applied key value to generate the idle key value. Such an arrangement can produce an idle key having a maximum variation from a previously applied key.

According to another aspect of the embodiments, a logic circuit can selectively change bits of the applied key value to generate the idle key value. Selective changing of bit values can be in response to one or more control signals. Such an arrangement can allow the bit change value to be tuned anywhere from a minimal value (e.g., only one bit change) to a maximum value (e.g., all bits change).

According to another aspect of the embodiments, a selection circuit can include a key multiplexer (MUX) having one input coupled to receive a key value associated with a search operation, another input coupled to a logic circuit, and an output coupled to a CAM section.

According to another aspect of the embodiments, a search engine system can also include a feedback path coupled between a key MUX output and the logic circuit. In this way, a previously applied key can be supplied to a logic circuit to generate an idle key.

According to another aspect of the embodiments, a search engine system can also include a register for storing the idle key output from the logic circuit.

The present invention can also include a current control method for a search engine system. According to such a method, in a search operation, a key value corresponding to the search operation can be provided to a CAM section. In an idle operation, an internally generated key value that varies from a key provided in a previous operation can be provided to the CAM section.

By providing an idle key that always varies from a previously applied key, current consumption due to key value variation can be ensured.

According to one aspect of the embodiments, an internally generated key value can be generated by changing the key value provided in the previous operation. In this way, the previous applied key can be used to generate an idle key.

According to another aspect of the embodiments, changing a key value provided in a previous operation can include complementing the bit values of at least a portion of the key value provided in the previous operation.

According to another aspect of the embodiments, the method can include dynamically changing bit values of the key value provided in the previous operation in response to at least one control signal. Such a control signal can be used to change one bit value, or can be used to change multiple or all bit values.

The present invention can also include a search engine system having an applied key bus that provides an applied key value to a search engine section. In addition, a logic circuit can have an input coupled to the applied key bus, and can alter at least a portion of the applied key value to generate an idle key value. An idle key value can be applied to a search engine section in a non-search operation. In such an arrangement, an idle key value can be guaranteed to be different from a previously applied key value. Thus, application of such key to a search engine section can be essentially guaranteed to draw a predetermined amount of current.

According to another aspect of the embodiments, a search engine system can include a plurality of separately searchable CAM sections, each including a plurality of CAM entries. In addition, a logic circuit can be provided that corresponds to each CAM section that provides an idle key value to the corresponding CAM section. In this way, idle key values can be generated in a local fashion.

According to another aspect of the embodiments, a search engine system can include a plurality of separately searchable CAM sections, each including a plurality of CAM entries. In addition, a logic circuit can provide an idle key value for all such CAM section. In this way, idle key values can be generated in a global fashion.

BRIEF DESCRIPTION OF THE DRAWINGS

FIG. 1 is a block schematic diagram of a search engine system according to a first embodiment of the present invention.

FIG. 2A is a block schematic diagram showing an arrangement for static variation of an idle key value.

FIG. 2B is a schematic diagram of bit changing arrangement that can be used in a static variation arrangement like that of FIG. 2A.

FIGS. 3A to 3C show various examples of static idle key generation according to embodiments of the present invention.

FIG. 4A is a block schematic diagram showing an arrangement for dynamic variation of an idle key value.

FIGS. 4B and 4C are schematic diagrams of bit changing arrangements that can be used in a dynamic variation arrangement like that of FIG. 4A.

FIGS. 5A to 5C show various examples of dynamic idle key generation according to embodiments of the present invention.

DETAILED DESCRIPTION

Figure 6:
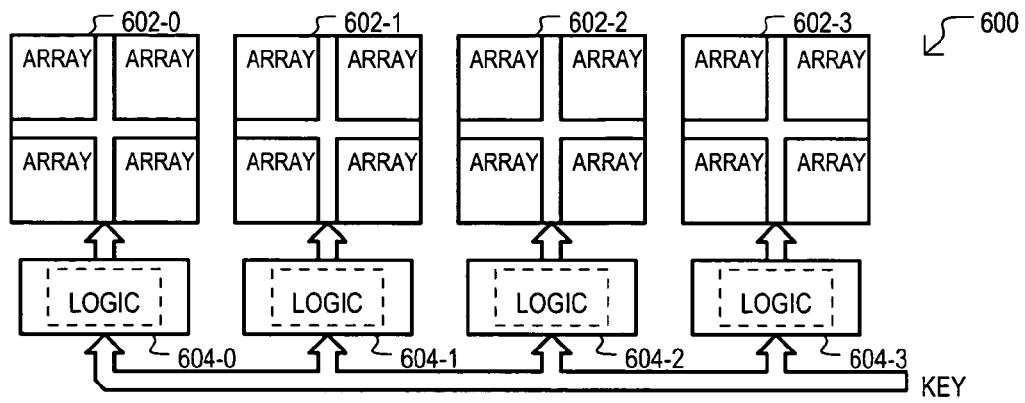
FIG. 6 is a block schematic diagram of a search engine system having local idle key generation according to one embodiment of the present invention.

The embodiments of the present invention can include a search engine system that can ensure current drawn is maintained at some level by applying a key during idle time periods that can always vary from a previously applied key. Such a variation in search key value scan be static, altering the same bit values between operations, or dynamic, changing which particular bit values are altered between operations.

A search engine system device according to a first embodiment will now be described with reference to FIG. 1, and is designated by the general reference character 100. A search engine system can be a CAM device 100 having a CAM section 102, a key multiplexer (MUX) 104, a register 106, and a logic circuit 108. A CAM section 102 can execute search operations in response to an applied search key value KEY_APP. As but one example, a CAM section 102 can include CAM cells forming one or more arrays, with groups of CAM cells forming entries. Such CAM cells can include, without limitation, a ternary CAM cell array, pseudo-ternary CAM cell array and/or binary CAM cell array. It is understood that a pseudo-ternary CAM array can provide global masking capabilities across multiple entries.

A key MUX 104 can receive a search key KEY_SRCH and an idle key KEY_IDLE as inputs. In response to a control signal IDLE, key MUX 104 can output either search key KEY_SRCH or idle key KEY_IDLE onto a key bus 110. A value on key bus KEY_APP can be utilized as a search key for CAM section 102. A search key KEY_SRCH can be an "actual" search key value that yields valid search results. For example, a search key KEY_SRCH can be, or can be derived from, externally received key data received with a search instruction. As will be described in more detail below, an idle key KEY_IDLE can be a key value that is not intended to yield valid search results, and can always vary between operations (cycles).

A logic circuit 108 can receive a key value KEY_APP on key bus 110, and alter such a key value to generate an idle key value KEY_IDLE. This can ensures that any idle key issued in a non-search operation can vary from a previously applied key. Register 106 can store idle key value KEY_IDLE, and provide such a value to an input of key MUX 104.

Having described the general components of a CAM device, the operation of the CAM device of FIG. 1 will now be described.

Figures 9, 10:
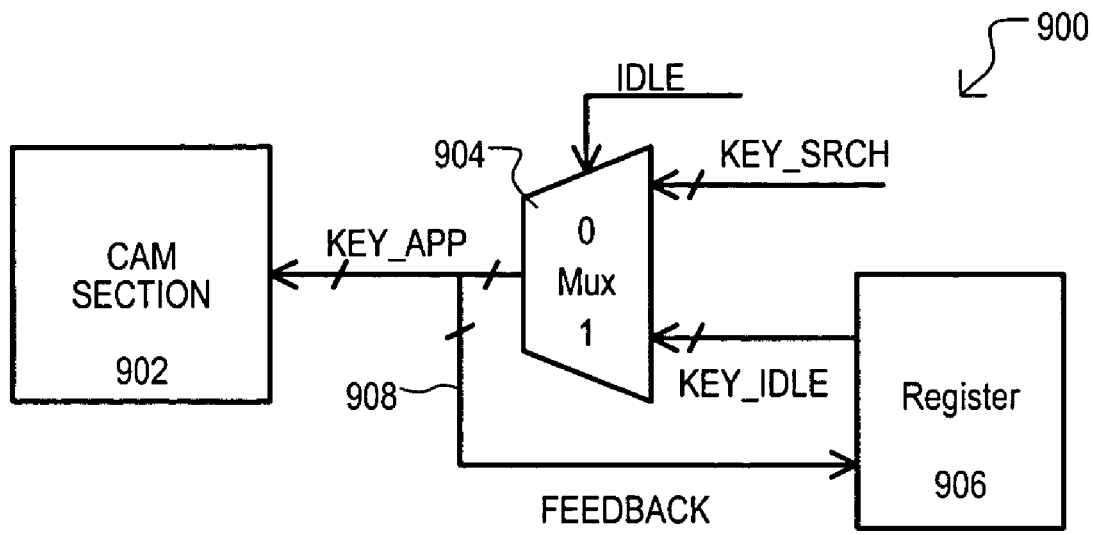
FIG. 9 is a block schematic diagram of a conventional approach for providing a key during an idle operation.
FIG. 10 shows an example of idle key generation according to arrangement shown in FIG. 9.

In a search operation, a selection signal IDLE can be low, and key multiplexer 104 can provide a regular search key KEY_SRCH to CAM section 102 as an applied key value KEY_APP. A key value KEY_APP on key bus 110 can be fed back for reuse in subsequent idle operations. However, unlike an arrangement like that of FIG. 9, a key value KEY_APP can be supplied to a logic circuit 108. Logic circuit 108 can alter a received key value to generate an idle key KEY_IDLE. Such an idle key can be stored and output by register 106.

In a non-search operation or selected non-search operations, a selection signal IDLE can be high, and key multiplexer 104 can provide an idle search key KEY_IDLE to CAM section 102. Due to the operation of logic circuit 108, such a key value will be different from a key value applied in the previous operation. In this way, a key value applied in a non-search operation can always be different from a previously applied key value.

It is understood that while a non-search operation can include idle operations (cycles), an idle key could be issued to CAM sections during other operations. For example, in a search engine system having multiple CAM sections, while a write or read operation is occurring for one CAM section, an idle key could be applied to the other CAM sections.

A logic circuit 108 can alter a received key value in a number of ways. For example, a logic circuit 108 can operate in a static fashion, altering the same set of bits in each operation. One very particular arrangement of such a static approach is shown in FIGS. 2A to 3C.

FIG. 2A is a block schematic diagram showing portions of the CAM device of FIG. 1, but with the first digit being a "2" instead of a "1". In FIG. 2A logic circuit 208 can be a static logic circuit, altering a key value in the same fashion between operations.

The manner in which a key value can be altered can take numerous forms. In one approach, one or more bits of an applied key value KEY_APP can be inverted. FIG. 2B shows one very particular approach to altering a key bit value with an inverter circuit. It is understood that such an inversion can occur for only selected bits, or can be for all bits depending on the amount of variation desired.

FIGS. 3A to 3C illustrate but three of the many possible ways to provide static variation in key values. FIG. 3A shows a "full complement" variation, in which all bits of an applied key value KEY_APP can be inverted to generate an idle key value KEY_IDLE. FIG. 3A shows a resulting applied key value for three cycles 0-2. A first cycle 0 can be a regular search cycle, and a received key value can be the applied key value. The bits for the key of cycle 0 can all be inverted by operation of a logic circuit (e.g., 208) and stored in a register 206. The next two cycles 1-2 can be idle cycles. In cycle 1, the idle key value previously stored in register 206 can be provided as the applied key value KEY_APP. In the same fashion, the bits for the key of cycle 1 can all be inverted by operation of a logic circuit (e.g., 208) and stored in a register 206. Such a value can then be applied in the next idle operation of cycle 2.

An arrangement like that of FIG. 3A can provide a maximum current draw component for a key value, as all bits of a key value can change. However, it may be desirable to provide lower current rates. FIGS. 3B and 3C show two variations providing lower current consumption by inverting less than all bits of a key value. FIG. 3B shows an arrangement in which a logic circuit (e.g. 208) can invert every other bit of a key value. FIG. 3C shows an arrangement in which every fourth bit of a key value can be inverted.

In this way, a logic circuit can provide static control of bit variation for idle key values.

A logic circuit can also alter a received key value in a dynamic fashion according to one or more control signals. Some very particular arrangements of such a dynamic approach are shown in FIGS. 4A to 5C.

FIG. 4A is a block schematic diagram showing portions of the CAM device of FIG. 1, but with the first digit being a "4" instead of a "1". In FIG. 4A logic circuit 408 can be a dynamically controlled logic circuit, altering a key value according to one or more control signals CTRL.

The manner in which a key value can be altered dynamically can take numerous forms. FIG. 4B shows one very particular approach to altering a key bit value with an exclusive-OR (XOR) type gate/function. It is understood that such a circuit can occur for all bits of key value, or for only selected bits. In the arrangement of FIG. 4B, when a control signal CTRL[k] has a low value, an output bit value KEY_IDLE[i] can be the same as a received bit value KEY_APP[i]. In contrast, when a control signal CTRL[k] has a high value, an output bit value KEY_IDLE[i] can be the inverse of a received bit value KEY_APP[i]. Of course, a control signal CTRK[k] could control the inverting (toggling) of one bit or multiple bits. FIG. 4C is a schematic diagram of a circuit that can provide an XOR type function.

It is understood that a dynamic control arrangement can provide for numerous ways in which a key value can be altered. FIGS. 5A to 5C illustrate but three possible examples of dynamic control of key bit toggling. FIG. 5A shows an arrangement in which every fourth bit changes, but in a rolling fashion. That is, the applied key KEY_APP differs between cycles 0 and 1 at bit locations 0, 4, 8 and 12, and differs between cycles 1 and 2 at bit locations 1, 5, 9 and 13, etc.

FIG. 5B shows a ramping arrangement, in which an increasingly larger number of bits are activated. Thus, the applied key KEY_APP differs between cycles 0 and 1 at four bit locations, and differs between cycles 1 and 2 at eight bit locations, and differs between cycles 1 and 2 at twelve bit locations. Of course, while FIG. 5B shows a ramp-up arrangement, ramp-down arrangements are also possible. FIG. 5C shows an arrangement in which top and bottom portions of a key value are toggled on alternate cycles.

In this way, a logic circuit can provide dynamic control of bit variation for idle key values.

Of course, a typical key value will have a considerably larger number of bits than shown in FIGS. 3A to 3C and 5A to 5C. Sixteen bits are shown only to avoid unduly complicating the description.

In addition, while the logic operations disclosed have inverted bit values with particular operations, alternate arrangements could include different types of manipulations, including bit shifting, logically ANDing, etc. Thus, the particular logical operations disclosed should not necessarily be considered limiting to the invention.

Key variation according to the various embodiments above can be advantageously implemented in a "global" fashion or a "local" fashion with respect to sections of a search engine system. Two examples of such an arrangement is shown in FIGS. 6 and 7.

FIG. 6 is a block diagram of a CAM device 600 having a number of CAM sections 602-0 to 602-3, each of which can be separately searchable. Each CAM section (602-0 to 602-3) can have a corresponding key control circuit 604-0 to 604-3 that can alter a previously applied key to generate an idle key for application in a non-search operation. Thus, idle key values can be generated in a local fashion for each CAM section (602-0 to 602-3).

Figure 7:
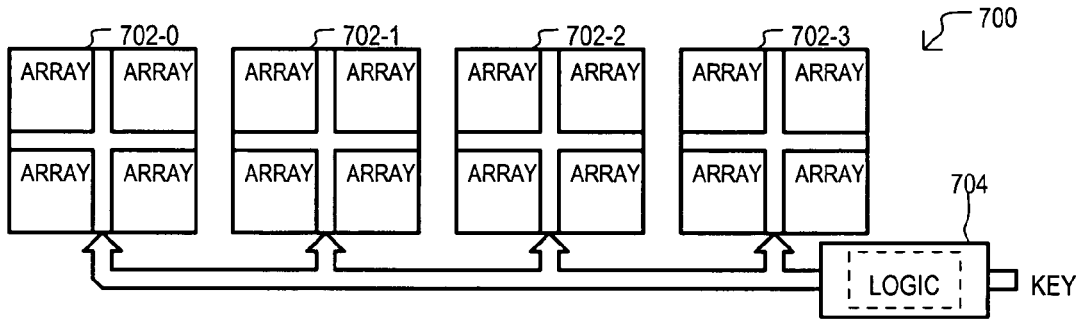
FIG. 7 is a block schematic diagram of a search engine system having global idle key generation according to one embodiment of the present invention.

FIG. 7 is a block diagram of a CAM device 700 having a number of separately searchable CAM sections 702-0 to 702-3. However, unlike the arrangement of FIG. 6, the CAM device 700 can include one key control circuit 704 for multiple CAM sections (702-0 to 702-3). Key control circuit 704 can provide key alteration as described above. In this way, an idle key value can be generated in a global fashion for multiple CAM sections (702-0 to 702-3).

Of course, the above embodiments represent particular implementations and should not be considered limiting to the invention. Various components can be substituted with equivalents, or situated in different positions. As but one example, a register (e.g., 106) can be situated at the output of a key MUX 104, rather than at an input.

Figure 8:
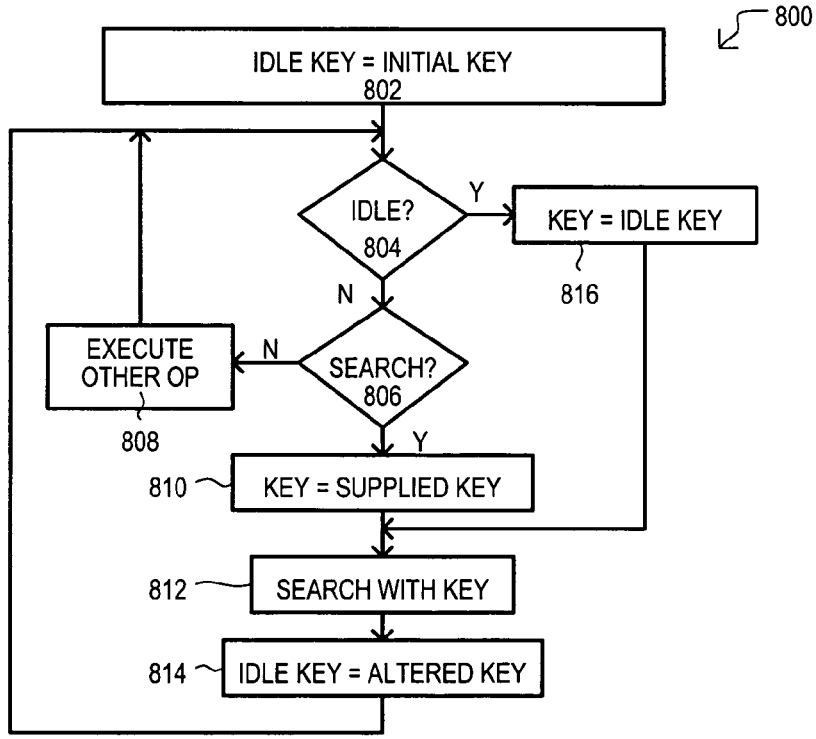
FIG. 8 is a flow diagram showing a method according to one embodiment.

Having described various search engine (e.g., CAM device) embodiments of the present invention, a method according to the present invention will now be described with reference to FIG. 8. FIG. 8 is a flow diagram of a method for providing changing key values in non-search operations of a search engine device. The method 800 can include setting an idle key value to some initial key value (step 802). A method 800 can then determine if an upcoming operation is an idle operation (step 804). If the upcoming operation is not an idle operation, the method can determine if the operation is a search operation (step 806). Of course, step 804 can be designed to determine the presence of any of a number of non-search operations, not just an idle operation, in which an idle key will be applied.

If the operation is not a search operation, the other operation can be executed (step 808). If the operation is a search operation, a key value can be a supplied key value (step 810) and a search can be executed with such a key value (step 812).

Once a search has been performed, an idle key value can be generated by altering the applied key value (step 814). A method 800 can then return to determining the type of upcoming operation (step 804).

If an upcoming operation is an idle operation (or non-search operation in which dummy searches will be used), a key value can be set to the current idle key value (step 816), and a search can be executed with such a key (step 812), and the method 800 can proceed as before, including altering the applied key to arrive at new idle key that is guaranteed to be different.

It is understood that a search with a supplied key value will yield valid search results, while results from a search with an idle key value can be ignored.

It will also be appreciated that the steps of the method shown in FIG. 8 need not be in the sequence shown, and some steps may occur essentially simultaneously with others.

It is also understood that the embodiments of the invention may be practiced in the absence of an element and or step not specifically disclosed. That is, an inventive feature of the invention can be elimination of an element.

The various embodiments can advantageously provide accurate setting of the current draw resulting from key data, allowing from one to all key bit values to be toggled between cycles. This is in contrast to conventional cases that may provide a same key value. Further, by logically changing a previous key, the amount of current draw can be independent of the key value.

In addition, as noted above, the number of bits toggled can be static or dynamically set. In the dynamic case, the number bits toggled can be selected based on one or more control signals. Such a dynamic case may be particularly valuable as a user can configure a device for optimal power consumption while taking speed and functionality in mind.

Still further, in the arrangements shown, key manipulation may be disabled. For example, in the arrangement of FIG. 1, a signal IDLE can be forced low. Thus, in systems where robust power supplies are present, the feature may be disabled. In contrast, in those systems that are less capable of handling current transients, such a feature can be enabled.

The above embodiments may also be advantageously compact in size, as a logic circuit may be as large as a key width, and implemented with standard logic. Along these same lines, a logic circuit as shown above in FIGS. 6 and 7 may be implemented at any of various levels of a CAM device (e.g., global, or local on any of a number of levels depending upon the CAM device).

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A search engine system, comprising:
   at least one content addressable memory (CAM) section that draws current in response to an applied key value;
   a logic circuit that changes at least a portion of the applied key value to generate an idle key value; and
   a selection circuit for selectively providing a key value associated with a search operation or the idle key value as the applied key value.

2. The search engine system of claim 1, wherein:
   the logic circuit changes all the bits of the applied key value to generate the idle key value.

3. The search engine system of claim 1, wherein:
   the logic circuit selectively changes bits of the applied key value to generate the idle key value.

4. The search engine system of claim 1, further including:
   the selection circuit comprises a key multiplexer (MUX) having one input coupled to receive a key value associated with a search operation, another input coupled to the logic circuit, and an output coupled to the CAM section.

5. The search engine system of claim 1, further including:
   a register for storing the idle key output from the logic circuit.

6. The search engine system of claim 3, wherein:
   logic circuit selectively changes bits of the applied key value in response to at least one control signal.

7. The search engine system of claim 5, further including:
   a feedback path coupled between the key MUX output and the logic circuit.

8. A search engine system current control method, comprising the steps of:
   in a search operation, providing a key value corresponding to the search operation to a CAM section; and
   in an idle operation, providing an internally generated key value that varies from a key value provided in a previous operation to the CAM section.

9. The method of claim 8, wherein:
   the internally generated key value is generated by changing the key value provided in the previous operation.

10. The method of claim 9, wherein:
    changing the key value provided in the previous operation includes complementing the bit values of at least a portion of the key value provided in the previous operation.

11. The method of claim 9, wherein:
changing the key value provided in the previous operation includes changing all the bit values of the key value provided in the previous operation.

12. The method of claim 9, wherein:
changing the key value provided in the previous operation includes changing less than all the bit values of the key provided in the previous operation.

13. The method of claim 9, wherein:
changing the key value provided in the previous operation includes dynamically changing bit values of the key value provided In the previous operation in response to at least one control signal.

14. The method of claim 13, wherein:
dynamically changing bit values includes providing one control signal that controls the changing of one bit value.

15. The method of claim 13, wherein:
dynamically changing bit values includes providing one control signal that controls the changing of a plurality of bit values.

16. A search engine system, comprising:
an applied key bus that provides an applied key value to at least one search engine section; and
at least one logic circuit having an input coupled to the applied key bus that alters at least a portion of the applied key value to generate an idle key value that is applied to the at least one search engine section in a non-search operation.

17. The search engine system of claim 16, further including:
a key multiplexer (MUX) having a first input coupled to receive a search key value generated in response to a search operation, a second input coupled to the logic circuit to receive the idle key value, and an output coupled to the applied key bus.

18. The search engine system of claim 16, further including:
a register that stores a key value having an output coupled to the at least one search engine section.

19. The search engine system of claim 16, wherein:
the at least one search engine section includes a plurality of separately searchable CAM sections, each including a plurality of CAM entries; and
the at least one logic circuit includes a logic circuit corresponding to each CAM section that provides an idle key value to the corresponding CAM section.

20. The search engine system of claim 16, wherein:
the at least one search engine section includes a plurality of separately searchable CAM sections, each including a plurality of CAM entries; and
the at least one logic circuit includes a logic circuit that provides an idle key value to the plurality of CAM sections.

* * * * *

UNITED STATES PATENT AND TRADEMARK OFFICE
CERTIFICATE OF CORRECTION

| | | |
|---|---|---|
| PATENT NO. | : 7,339,810 B1 | Page 1 of 1 |
| APPLICATION NO. | : 11/089837 | |
| DATED | : March 4, 2008 | |
| INVENTOR(S) | : Scott Smith | |

It is certified that error appears in the above-identified patent and that said Letters Patent is hereby corrected as shown below:

<u>IN THE CLAIMS</u>

At column 8, line 50, Claim 7, please replace the claim dependency from "5" to

-- 4 -- so that the corresponding phrase reads -- The search engine system of claim 4 --.

Signed and Sealed this

Second Day of September, 2008

JON W. DUDAS
*Director of the United States Patent and Trademark Office*